United States Patent Office 3,585,010

Patented June 15, 1971

3,585,010

PRINTED CIRCUIT BOARD AND METHOD OF MAKING SAME

Betty M. Luce and Betty L. Berdan, Willowick, Ohio assignors to Clevite Corporation No Drawing. Filed Oct. 3, 1968, Ser. No. 764,947
Int. Cl. H05k *1/00;* B41m *3/08*
U.S. Cl. 29—191.2 5 Claims

ABSTRACT OF THE DISCLOSURE

This invention is directed to the conducting element of a printed circuit comprising a copper foil and a metallic barrier layer having utility in substantially reducing the staining of printed circuit boards, said metallic barrier layer is a thin deposit on the copper foil of a metal selected from the group consisting of zinc, indium, nickel, tin, cobalt, brass, and bronze.

This invention pertains to electrochemical surface treatments of copper foils that yield improved metal composites for use as conducting elements in printed circuits and method of making the same.

Printed circuits are widely used in a variety of electronic applications, such as radios, televisions, computers, etc. Of particular interest are multi-layer laminates which have been developed to meet the demand for miniature electronic articles and the growing need for printed circuit boards having a high density of interconnections. These laminates of synthetic plastics or resins and copper foil are made in such a way that circuits are possible not only on the surface but also spaced throughout the thickness of the laminates. In order for the single or multi-layer laminate to operate satisfactorily the resistivity of the plastic layer and the peel strength of the copper foil, among other things, must be maintained as high possible. Thus, strict production quality control measures are followed, and special requirements on raw materials, such as the copper foil and the adhesive, are imposed. In U.S. Pat. No. 3,220,897 there is disclosed a copper foil which has been treated electrolytically to provide it with a "nodularized" surface for better adhesion. Similarly, in U.S. Pat. No. 3,293,109 a copper foil is found to have better adhesive properties when provided with an external surface having myriad minute projections whose inner cores contain copper copper oxide particles, said minute projections being encapsulated by a copper coating.

The two types of copper foil as taught by the two above-mentioned patents are excellent when it comes to adhesion, whether in one layer or multi-layer laminates. One source of difficulty, however, has been the frequent appearance of stains and spottings throughout the resinous layer of the finished printed circuit boards. These stains of which brown spotting is a particularly troublesome type tend to adversely affect the dielectric properties of the resin and consequently the over-all performance of the printed circuit. Likewise, the physical appearance of the final product is undesirable.

The actual mechanism for this staining is not fully understood; however, the cause appears to be the result of chemical and/or mechanical interactions between the copper foil and the resin layer. The lamination step which involves high pressure-high temperature treatment seems to give rise to such interactions which are manifested as degradation of the adhesion of the foil upon heat aging and together with staining of the epoxy/glass board.

It is an object of this invention to provide a treated copper foil for use in single or multi-layer laminates whereby staining of the resinous layer is substantially reduced.

Another object of the invention is to provide a laminate of copper foil composite structure wherein the treated copper foil prevents thermal degradation of the adhesive layer of the laminate.

A still further object is to provide a method of substantial elimination of staining of printed circuit boards. Other objects of the invention will become readily apparent from the following description.

We have found that staining and brown spotting are substantially reduced in single and multi-layer laminates when the copper foil used therewith is electrochemically treated by electrodepositing on it a thin layer of indium, zinc, tin, nickel, cobalt, brass (copper-zinc alloys) or bronze (copper-tin alloys). This layer whose thickness can be as low as 4 millionths of an inch behaves as a barrier between the copper foil and the resinous substrate and renders the copper foil laminate impervious to development of staining. The absence of staining is believed to be effected by eliminating the chemical and/or mechanical interactions between the metallic copper and the resin.

The barrier layer is applied on the copper foil in accordance with known and standard electro-deposition procedures pertaining to the particular metallic layer. At this juncture, it should be stated that the surface of the copper foil, whether rolled or electrodeposited, can be of any configuration, i.e., smooth or nodularized. However, because of better adhesion the nodularized surface is preferred.

The thickness of the barrier layer as calculated from Faraday's law may be varied. Barrier layers about 4 millionths of an inch thick operate satisfactorily when deposited on foils that are relatively clean of oxides or loose particles. If, however, the foil has been pre-treated for adhesion purposes to have a nodularized surface or one having a somewhat displaceable layer of copper-copper oxide particles, the thickness of the barrier layer should be increased sufficiently to encapsulate the particles and/or the dendrites of copper-copper oxide to prevent their transfer into the resin during lamination. Of course, the thickness of the barrier layer cannot exceed the limit whereby the purity and conductivity of the copper foil are adversely affected. It should be understood that in the application of this invention the barrier layer need not be electrodeposited on the surface of the copper foil as it can be applied thereon by other means such as vapor deposition.

After the deposition of the barrier layer is completed the copper foil is then rinsed and is ready for lamination. It may be desirable, however, to treat the foil, prior to lamination, with a corrosion inhibiting agent.

Excellent results have been obtained when copper foils treated in accordance with this invention are used as the conducting elements in printed circuits and particularly multi-layer laminates. No staining is observed after lamination and the peel strength is held substantially the same after post-curing or heat aging at 150° C. for as long as 100 hours.

The following examples demonstrate the advantages of this invention. It should be noted that peel strength indicates the effectiveness of the adhesive bond and is measured in terms of the force in pounds necessary to separate a one-inch wide strip of the copper foil from the resinous substrate when pulled at an angle of 90° to the surface. Peel strength in excess of 7 pounds per inch is necessary to satisfy printed circuit requirements.

EXAMPLE I

Brass barrier layer

A nodularized one-ounce copper foil was drawn through a plating solution of the following composition with anodes disposed opposite one face of the foil:

| | G./l. |
|---|---|
| Sodium cyanide | 110 |
| Sodium hydroxide | 60 |
| Copper cyanide | 90 |
| Zinc cyanide | 5.3 |

The temperature of the bath was maintained at about 50° C. The pH at 11.0–11.5 and current density at 50 a.s.f. (amperes per square foot). The time of exposure was 10 seconds which gave a brass layer 10–12 millionths of an inch thick. The brass is of the alpha type, i.e., about 65% Cu and 35% Zn.

The efficiency of the bath was calculated from tests run on samples plated on stainless steel panels for weight determination and chemical analysis. Typical runs at 50 a.s.f., 50° C. and 11.4 pH gave the following:

| | Wt. gain (gms.) | Percent Cu | Thickness, millionths of an inch (calculated) |
|---|---|---|---|
| Time (sec.): | | | |
| 5 | .0140 | 64.3 | 5.4 |
| 15 | .0376 | 67.6 | 14.5 |
| 30 | .0584 | 66.1 | 22.6 |

The thickness is calculated from the formula:

$$t=\frac{.394\times \text{wt. gain}}{A\times \rho}$$

wherein A is area in centimeter square and $\rho$ is density of alloy in grams per cubic centimeter.

TABLE I

| | Barrier layer | Thickness, millionth of an inch | Peel strength, lbs./in.: As laminated | Peel strength, lbs./in.: After heat aging at 150° C. for 72 hours | Remarks |
|---|---|---|---|---|---|
| 1 | | | 7.5–8 | 6–7 | Spotting and stains are observed. |
| 2 | Brass | 4 | 8.3 | 8.3–8.5 | Clean—no staining. |
| 3 | do | 8.5 | 8.0 | 8.0 | Do. |
| 4 | Zinc | 12 | 8.5–9.0 | 8.0–8.5 | Do. |
| 5 | Bronze (90% Cu plus 10% Sn) | 10 | 7.0–7.4 | [1] 9 | Do. |
| 6 | Indium | 10 | 8.2–8.4 | [1] 9.5–10 | Do. |
| 7 | Cobalt | 25 | 7.8 | 7.8–8.0 | Do. |
| 8 | Nickel | 5 | 8.0 | 8.2–8.4 | Do. |
| 9 | Tin | 6 | 8.3–8.5 | 9.0–9.2 | Do. |

[1] Heat-aged for 100 hours.

The copper foil-brass layer composite was then laminated with General Electric FR4 epoxy/glass. The resinous substrate was clean and free of straining. After heat aging at 150° C. for 72 hours the peel strength was unchanged at 8.3 lbs./in.

EXAMPLE II

Nickel barrier

The procedure of Example I was followed using a plating solution composed of:

| | G./l. |
|---|---|
| Nickel sulfate | 240 |
| Nickel chloride | 45 |
| Boric acid | 30 |

The current density employed was 30 a.s.f., temperature 40–45° C., pH 2.5–3.0, time 20 sec. The thickness of the barrier layer was 8.5 millionths of an inch calculated on predetermined 95–98% efficiency basis.

The copper foil-nickel layer composite was then laminated as was done in Example I with the result that no staining was observed and no loss in peel strength.

EXAMPLE III

Zinc barrier

The procedure of Example I was followed using a plating solution composed of:

| | G./l. |
|---|---|
| Zinc sulfate | 350 |
| Licorice | 1 |

The current density employed was 40 a.s.f.; pH 4.2; temperature 55° C.; time 30 sec.

The thickness of the barrier layer was 20–25 millionths of an inch based on a calculated efficiency of 95%.

The copper foil-zinc layer composite was laminated as was done in Example I with the result that no staining nor loss of peel strength were observed.

EXAMPLE IV

Indium barrier

The procedure of Example I was followed using a plating solution identified as Bath CY–AN–IN (obtained from Indium Corp. of America).

The thickness of the barrier layer was determined by efficiency tests run prior to each plating. The particular bath used was capable of supplying 11.5 mg. of indium per one ampere minute. Each 1.21 mg. per square inch of indium equals ten millionths of an inch. A test sample 24 square inches was plated at one ampere for 2 minutes or a total of 23 mg. Thus, the thtickness of the barrier was approximately 8 millionths of an inch thick. Again after lamination no staining was observed.

Other examples demonstrating the advantages of the barrier layers of this invention are listed in Table I wherein a nodularized one-ounce copper foil is used and the laminate is GE–FR4 epoxy/glass.

Printed circuits utilizing the copper foil-metallic layer composite structure as conducting elements therefor have developed little or no staining of the resinous layers after lamination. Moreover, no loss of peel strength was observed. When the printed circuit boards are observed visually they usually have clean appearance in contrast to those utilizing copper foils without the benefit of the barrier layer. Electron microprobe studies on laminates employing the instant invention have shown a significant reduction of copper ion migration into the resinous layers.

Inasmuch as specific examples and embodiments have been illustrated and described, some changes or modifications will become apparent to those skilled in the art without departing from the scope and spirit of this invention. It is, therefore, intended to cover in the appended claims all such particulars.

What is claimed is:

1. A printed circuit board comprising: a resinous substrate, a composite metal structure comprising a layer of copper foil to one face of which there is directly secured in intimate contact one face of a thin metallic layer selected from the group consisting of zinc, indium and brass, the other face of said thin metallic layer being secured to said resinous substrate.

2. A printed circuit board in accordance with claim 1 in which the barrier layer is at least 4 millionths of an inch thick.

3. A printed circuit board in accordance with claim 1 where the surface of the copper foil is nodularized, and dendrites of copper and/or copper oxide particles are present on the surface of the copper foil and in which the barrier layer thickness is sufficient to encapsulate the copper and/or copper oxide particles.

4. The method of making a printed circuit board comprising the steps of providing a resinous substrate and a layer of copper foil, electrodepositing directly on one face of said layer of copper foil a thin metallic layer selected from the group consisting of zinc, indium and brass, affixing said layer of copper foil to said substrate with said thin metallic layer positioned between said layer of copper foil and said substrate where it acts as a barrier layer to substantially reduce staining of said resinous susbtrate by said layer of copper foil.

5. The method as defined in claim 4 wherein the thickness of the barrier layer is at least 4 millionths of an inch.

References Cited

UNITED STATES PATENTS

| | | | |
|---|---|---|---|
| 2,754,353 | 7/1956 | Gilliam | 29—195UX |
| 2,802,897 | 8/1957 | Hurd et al. | 29—195X |
| 2,939,207 | 6/1960 | Adler | 29—195 |
| 3,220,897 | 11/1965 | Conley et al | 148—34 |
| 3,293,109 | 12/1966 | Luce et al. | 148—34X |
| 3,377,259 | 4/1968 | Phillips | 29—195X |

FOREIGN PATENTS

| | | | |
|---|---|---|---|
| 112,925 | 4/1941 | Australia | 29—195 |

ALLEN B. CURTIS, Primary Examiner

U.S. Cl. X.R.

29—195; 156—151; 204—44, 45, 55